US007893728B2

(12) United States Patent
Hirai

(10) Patent No.: US 7,893,728 B2
(45) Date of Patent: Feb. 22, 2011

(54) VOLTAGE-CURRENT CONVERTER AND VOLTAGE CONTROLLED OSCILLATOR

(75) Inventor: Kazunosuke Hirai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 40 days.

(21) Appl. No.: 12/289,758

(22) Filed: Nov. 3, 2008

(65) Prior Publication Data
US 2009/0140776 A1      Jun. 4, 2009

(30) Foreign Application Priority Data
Dec. 3, 2007    (JP)  .............................. 2007-312259

(51) Int. Cl.
*H02M 11/00*    (2006.01)
*H03F 3/45*    (2006.01)
(52) U.S. Cl. ........................... 327/103; 327/53; 327/543
(58) Field of Classification Search .................... 327/53, 327/103, 543
See application file for complete search history.

(56) References Cited
U.S. PATENT DOCUMENTS 5,477,170 A * 12/1995 Yotsuyanagi ................. 327/66
5,892,390 A * 4/1999 Tobita ......................... 327/543
6,650,164 B2    11/2003 Kondo
2002/0175733 A1    11/2002 Kondo

FOREIGN PATENT DOCUMENTS

JP     2002-344251     11/2002

* cited by examiner

*Primary Examiner*—Lincoln Donovan
*Assistant Examiner*—John W Poos
(74) *Attorney, Agent, or Firm*—McGinn Intellectual Property Law Group, PLLC

(57) ABSTRACT

An exemplary aspect of an embodiment of the present invention is a voltage-current converter converting an input voltage input to an input terminal to a current to output the current, the voltage-current converter including a first current generating circuit including an input transistor having a gate connected to the input terminal and generating an output current according to a current flowing in the input transistor, and a second current generating circuit including a transistor having a gate having a potential different from potential of a source and a drain, the second current generating circuit generating a superimposed current according to the current flowing in the transistor to supply the superimposed current to the input transistor.

11 Claims, 3 Drawing Sheets

VOLTAGE-CURRENT CONVERTER AND VOLTAGE CONTROLLED OSCILLATOR

BACKGROUND

1. Field of the Invention

The present invention relates to a voltage-current converter and a voltage controlled oscillator.

2. Description of Related Art

In recent years, the threshold value voltage of a transistor has been decreasing along with the high-speed operation and reduced voltage of LSI. Along with this, a leak current flowing between a source and a drain even when the transistor is in an off state, which is off leak, cannot be ignored. The off-leak current tends to be increased when the threshold value voltage of the transistor is low and the temperature is high. The off-leak current greatly influences on each characteristic especially in an analog design; therefore, any proper countermeasure should be taken in a low-voltage operation area.

An off-leak current cancel circuit for canceling such off-leak current is disclosed in Japanese Unexamined Patent Application Publication No. 2002-344251 (Kondo). The off-leak current cancel circuit disclosed in Kondo will be described with reference to FIG. 4. The off-leak current cancel circuit includes cancel portions 110 and 120. The cancel portions 110 and 120 cancel off-leak current of an input circuit protecting PMOS 102 and NMOS 103. The cancel portions 110 and 120 are formed on a semiconductor substrate of the PMOS 102 and NMOS 103. The PMOS 102 is connected between the input terminal 101 and a power supply potential VDD. The NMOS 103 is connected between the input terminal 101 and a ground potential GND.

The cancel portion 110 cancels off-leak current of the PMOS 102 and includes a PMOS 111 and NMOS 112, 113, 114. The PMOS 111 has a gate length identical to the PMOS 102 and a gate width of 1/n of the gate width of the PMOS 102. The PMOS 111 has a source and a gate connected to the power supply potential VDD and a drain connected to a node 131. That is, the PMOS 111 is diode-connected in the reverse direction like the PMOS 102 and configured so that 1/n of the off-leak current flowing in the PMOS 102 flows.

The node 131 is connected to the drain and the gate of the NMOS 112 whose source is connected to the ground potential GND. The node 131 is connected to the gate of the NMOS 113 whose drain and source are connected to the input terminal 101 and the ground terminal GND, respectively. The NMOS 113 has a gate length identical to the NMOS 112, and a gate width which is n times as large as the gate width of the NMOS 112. That is, the NMOS 112 and 113 constitute a current mirror circuit and the current n times as large as the current flowing in the NMOS 112 flows in the NMOS 113.

The NMOS 114 has a drain connected to the node 131. The NMOS 114 has a source connected to the ground potential GND and a gate connected to the power supply potential VDD. Accordingly, the NMOS 114 is always in on state. The NMOS 114 has a gate length and gate width formed so that the ON resistance of the NMOS 114 exhibits quite a high resistance value. Accordingly, the NMOS 114 makes the node 131 the ground potential GND for stability of the operation when almost no off-leak current is present in the PMOS 111.

The cancel portion 120 cancels off-leak current of the NMOS 103 and includes an NMOS 121 and PMOS 122, 123, 124. The NMOS 121 has a gate length identical to the NMOS 103 and a gate width of 1/n of the gate width of the NMOS 103. The NMOS 121 has a source and a gate connected to the ground potential GND and a drain connected to a node 132. That is, the NMOS 121 is diode-connected in the reverse direction like the NMOS 103 and configured so that 1/n of the off-leak current flowing in the NMOS 103 flows.

The node 132 is connected to the drain and the gate of the PMOS 122 whose source is connected to the power supply potential VDD. The node 132 is connected to the gate of the PMOS 123 whose drain and source are connected to the input terminal 101 and to the power supply potential VDD, respectively. The PMOS 123 has a gate length identical to the PMOS 122, and a gate width which is n times as large as the gate width of the PMOS 112. That is, the PMOS 122 and 123 constitute a current mirror circuit and the current n times as large as the current flowing in the PMOS 122 flows in the PMOS 123.

The PMOS 124 has a drain connected to the node 132. The PMOS 124 has a source connected to the power supply potential VDD and a gate connected to the ground potential GND. Accordingly, the PMOS 124 is always in on state. The PMOS 124 has a gate length and gate width formed so that the ON resistance of the PMOS 124 exhibits quite a high resistance value. Accordingly, the PMOS 124 makes the node 132 the power supply potential VDD for stability of the operation when almost no off-leak current is present in the NMOS 121.

Next, explanation will be given on operation. For example, when the ambient temperature is a room temperature and there is almost no off-leak current, the NMOS 114 of the cancel portion 110 is in an ON state and accordingly, the node 131 is almost ground potential GND and the NMOS 112 and 113 are in an OFF state. Similarly, the PMOS 124 of the cancel portion 120 is in an ON state and accordingly, the node 132 becomes almost power supply potential VDD and PMOS 122 and 123 become OFF.

Here, it is assumed that the ambient temperature has increased and off-leak current flows in the PMOS 102. The PMOS 102 and the PMOS 111 in the cancel portion 110 are formed on the same semiconductor substrate and have an identical gate length. Accordingly, off-leak current also flows in this PMOS 111. When the gate length is identical, the off-leak current flowing is proportional to the gate width and accordingly, the off-leak current flowing in the PMOS 111 becomes 1/n of the PMOS 102. The off-leak current flowing in the PMOS 111 flows into the node 131. The node 131 is connected to the NMOS 112 and 114 but since the NMOS 114 has quite a high resistance, almost no current flows in the NMOS 114. Accordingly, in the NMOS 112, current almost identical to the PMOS 111 flows. The NMOS 112 is connected to the NMOS 113 constituting a current mirror circuit of the current ratio of n multiples. Thus, current n times as large as the PMOS 111 flows in the ground potential GND through the NMOS 113. The current of the PMOS 111 becomes 1/n of the current of the PMOS 102; therefore, the current identical to the current flowing in the PMOS 102 flows in the NMOS 113.

Thus, the off-leak current flowing in the PMOS 102 all flows into the ground potential GND via the NMOS 113 and no off-leak current flows into the signal source connected to the input terminal 101. Similarly, the off-leak current flowing in the NMOS 103 is detected by the NMOS 121 for monitoring of the cancel portion 120 and supplied from the power supply potential VDD via the PMOS 123 to the NMOS 103. Accordingly, no off-leak current flows to the signal source connected to the input terminal 101.

As has been described, the circuit shown in FIG. 4 is a circuit for canceling the off-leak current of the input circuit protecting PMOS 102 and NMOS 103. The off-leak current flowing in the NMOS 103 is detected by the NMOS 121 for monitoring of the cancel portion 120. The current is supplied from the power supply potential VDD via the PMOS 123 to the NMOS 103 to cancel the off-leak current. Based on this background art, when the cancel circuit described above is applied to the voltage-current converter, the problem is raised as follows.

FIG. 5 is a circuit diagram showing a configuration of the voltage-current converter. In the voltage-current converter, the off-leak current of the NMOS 4 is cancelled by a second current generating circuit 12. Thus, the second current generating circuit 12 has a function of decreasing the off-leak current.

Even when the voltage of the input terminal 1 is the ground potential GND, current flows in the PMOS 6 due to the off-leak current of the NMOS 4. This off-leak current greatly depends on the threshold value voltage and the temperature. For example, the off-leak current especially increases when the threshold value voltage of the transistor is low and the temperature is high. Therefore, the off-leak current cannot be ignored depending on the diffusion state in the LSI and the operating temperature of the LSI or the like. Therefore, it becomes difficult to generate the current according to the input voltage. As such, the off-leak current degrades the accuracy of the output current, which degrades the characteristic of the analog circuit.

When the potential of the input terminal 1 increases and the gate potential of the NMOS 4 exceeds the threshold value voltage, current flowing in the node 21 also increases in proportion to the voltage amount that exceeds the threshold value voltage. However, when the large volume of off-leak current flows in the NMOS 4, it becomes difficult to generate the current according to the input voltage. The gate, the source, and the bulk of the NMOS 8 of the second current generating circuit 12 are connected to the ground GND. Therefore, even when the off leak flows in the NMOS 8, there is no voltage fluctuation occurred between the gate and the source. Further, there is no potential difference between the source and the bulk. Therefore, there is no change in the threshold value voltage of the transistor due to the back gate effect and the voltage fluctuation between the gate and the source. However, in the NMOS 4 of the voltage-current converter 11, the gate is connected to the input terminal 1, the source is connected to the resistance element 3, and the bulk is connected to the ground GND. Therefore, there is generated a difference potential between the source and the bulk, whereby the threshold value is made somewhat high due to the back bias effect. The off-leak current flowing in the NMOS 4 depends on the threshold value and the voltage between the gate and the source. The off-leak current flowing in the NMOS 4 of the voltage-current converter 11 is different from the current amount generated in the NMOS 8 in the second current generating circuit 12. Therefore, the current value almost the same as the current value flowing in the NMOS 4 cannot be generated in the NMOS 8. Accordingly, it is not possible to cancel the off-leak current flowing in the NMOS 4 without fail.

SUMMARY

According to the related off-leak current cancel circuit, it is not possible to accurately reproduce the off-leak current generated in the circuit such as the voltage-current converter in which a source is connected to a resistor. As such, according to the related voltage-current converter, the output current accuracy with respect to the input voltage decreases due to the off-leak current.

A first exemplary aspect of an embodiment of the present invention is a voltage-current converter converting an input voltage input to an input terminal to a current to output the current, the voltage-current converter including a first current generating circuit including an input transistor having a gate connected to the input terminal and generating an output current according to a current flowing in the input transistor, and a second current generating circuit including a transistor having a gate having a potential different from potential of a source and a drain, the second current generating circuit generating a superimposed current according to the current flowing in the transistor to supply the superimposed current to the input transistor. According to the present invention, it is possible to cancel the off-leak current flowing in the input transistor without fail; therefore, the output current accuracy with respect to the input voltage can be improved.

According to the present invention, it is possible to provide a voltage-current converter and a voltage controlled oscillator having a high output accuracy with respect to the input voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
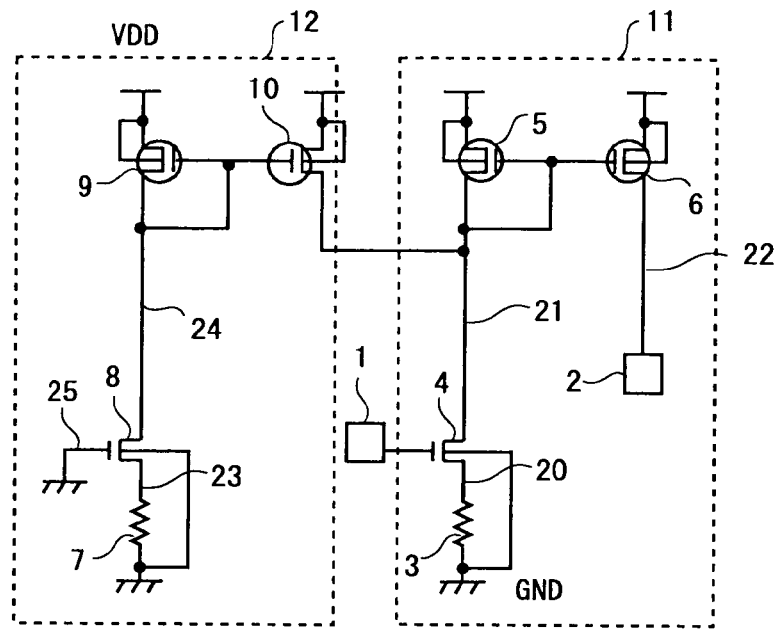
FIG. 1 is a circuit diagram showing a configuration of a voltage-current converter according to an exemplary embodiment of the present invention.

The exemplary embodiment to which the present invention can be applied will hereinafter be described. The following description describes the exemplary embodiment of the present invention, and this invention is not limited to the following exemplary embodiment. Hereinafter, some parts of the description are omitted and simplified as appropriate for the sake of clarity. A person skilled in the art would readily change, add or modify each element in the following exemplary embodiment within the scope of the present invention. The same components in each drawing are denoted by the same reference numerals, and the description thereof is omitted as appropriate.

A voltage-current converter according to the exemplary embodiment will be described with reference to FIG. 1. FIG. 1 is a circuit diagram showing a configuration of the voltage-current converter. The voltage-current converter includes a first current generating circuit 11 and a second current generating circuit 12.

The first current generating circuit 11 includes an output terminal 2, a resistance element 3, an NMOS (n channel type MOS transistor) 4, a PMOS (p channel type MOS transistor) 5, and a PMOS 6. The NMOS 4 is an input transistor, and a gate of the NMOS 4 is connected to an input terminal 1.

Accordingly, an input potential is supplied to the gate of the NMOS 4. A drain of the NMOS 4 is connected to a node 21. A source of the NMOS 4 is connected to a ground potential GND through the resistance element 3. In summary, one end of the resistance element 3 is connected to the source of the NMOS 4, and the other end of the resistance element 3 is connected to the ground potential GND. A node 20 is between the resistance element 3 and the source of the NMOS 4.

A drain and a gate of the PMOS 5 are connected to the node 21. A source of the PMOS 5 is connected to a power supply potential VDD. The PMOS 5 is diode-connected. Further, a gate of the PMOS 6 is connected to the node 21, and a source of the PMOS 6 is connected to the power supply potential VDD. A drain of the PMOS 6 is connected to the output terminal 2. The PMOS 6 has a gate length same to that of the PMOS 5, and has a gate width n (or 1/n) times as large as the gate width of the PMOS 6. Accordingly, the PMOS 5 and the PMOS 6 constitute a current mirror circuit of the current ratio of n multiples.

The current flows in the ground potential GND side according to the potential supplied to the input terminal 1. Therefore, the current flows from the power supply potential VDD to the PMOS 5, the NMOS 4, and the resistance element 3. The PMOS 5 and the PMOS 6 constitute a current mirror circuit. Therefore, the current according to the current flowing in the NMOS 4 flows into the output terminal 2 from the power supply potential VDD through the PMOS 6. In summary, the input voltage input to the input terminal 1 is converted into the current and the current is output from the output terminal 2. Thus the output current according to the input voltage is output from the output terminal 2.

The second current generating circuit 12 is a constant current circuit supplying the current to the NMOS 4 which is the input transistor. The second current generating circuit 12 outputs a superimposed current superimposed on the active current of the NMOS 4. Note that the active current of the NMOS 4 is a current flowing from the power supply potential VDD to the NMOS through the PMOS 5. Therefore, the active current is the current flowing in the NMOS 4 which does not include the current flowing from the second current generating circuit 12. Accordingly, the current actually flowing in the NMOS 4 in the voltage-current converter has the value which is obtained by adding the superimposed current to the active current of the NMOS 4. The superimposed current has the current value identical to the active current flowing in the NMOS 4 in a fixed input voltage.

The second current generating circuit 12 includes a resistance element 7, an NMOS 8, a PMOS 9, and a PMOS 10. The NMOS 8 has a gate length and a gate width identical to those of the NMOS 4. In the exemplary embodiment, a gate of the NMOS 8 is the ground potential GND. A drain of the NMOS 8 is connected to a node 24. A source of the NMOS 8 is connected to the ground potential GND through the resistance element 7. In summary, one end of the resistance element 7 is connected to the source of the NMOS 8, and the other end of the resistance element 7 is connected to the ground potential GND. A node 23 is between the resistance element 7 and the source of the NMOS 8. The resistance element 7 has the same resistance value as that of the resistance element 3. In summary, the resistance element 7 and the resistance element 3 have the same characteristics.

The node 24 is connected to a drain and a gate of the PMOS 9 whose source is connected to the power supply potential VDD. A gate of the PMOS 10 is connected to the node 24. A source of the PMOS 10 is connected to the power supply potential VDD. A drain of the PMOS 10 is connected to the node 21. The PMOS 9 and the PMOS 10 constitute a current mirror circuit of the current ratio of 1 multiple. For example, when the PMOS 9 and the PMOS 10 are formed to have the same gate width and the same gate length, the current mirror circuit of the current ratio of 1 multiple is formed. Note that the second current generating circuit 12 and the first current generating circuit 11 are formed on the same semiconductor substrate. As such, the second current generating circuit 12 and the first current generating circuit 11 almost have the same circuit arrangement.

First, explanation will be given on a case in which the gate of the input terminal 1 is the ground potential GND. The current flows in the NMOS 4 even when the input voltage is the ground potential GND. In summary, the off-leak current is generated in the NMOS 4. The NMOS 4 and the second current generating circuit 12 are formed on the same semiconductor substrate. Further, the NMOS 8 has the same gate length and the same gate width. Therefore, current identical to the current flowing in the NMOS 4 flows in the NMOS 8, which means the off-leak current of the NMOS 8 and the off-leak current of the NMOS 4 are equal to each other.

The NMOS 8 is connected to the PMOS 9, where the current identical to the current flowing in the NMOS 8 flows. The PMOS 10 is connected to the PMOS 9 constituting a current mirror circuit of the current ratio of 1 multiple. Accordingly, current identical to the current flowing in the NMOS 8 flows in the node 21 through the PMOS 10. In summary, current identical to the active current of the NMOS 4 is output from the second current generating circuit 12.

Now, description will be made on a case where the input voltage of the input terminal 1 increases. When the input voltage increases to exceed the threshold value voltage of the NMOS 4, current flowing in the node 21 also increases in proportion to the voltage amount that exceeds the threshold value voltage. Further, when the off-leak current is large, superimposed current is output from the second current generating circuit 12 in order to generate the output current according to the input voltage. The superimposed current has a current value identical to that of the active current flowing in a fixed input voltage. Then the superimposed current generated in the second current generating circuit 12 is supplied to the NMOS 4, and the potential of the node 21 changes. Accordingly, the off-leak current of the NMOS 4 is canceled by the superimposed current from the second current generating circuit 12.

The second current generating circuit 12 is formed to have the configuration substantially identical to the configuration of the first current generating circuit 11 in order to output such a superimposed current. For example, the ground potential GND is connected to the gate of the NMOS 8 corresponding to the NMOS 4 which is the input transistor. The superimposed current is superimposed on the active current of the NMOS 4 which is the input transistor. As a result, the output current accuracy in reduced voltage input can be corrected. As such, it is possible to obtain the output current depending on the threshold value voltage of the NMOS 4 and the input voltage.

The NMOS 8 and the NMOS 4 have the same gate length and the same gate width, and both of them are formed on the same semiconductor substrate. Accordingly, the NMOS 8 and the NMOS 4 substantially have the same property. Accordingly, the output current can be corrected with high accuracy.

Further, in the exemplary embodiment, the source of the NMOS 8 is connected to the ground potential GND through the resistance element 7. Accordingly, when the current flows between the source and the drain of the NMOS 8, the gate of the NMOS 8 has the different potential from those of the source and the drain. More specifically, although the gate of the NMOS 8 is connected to the ground potential GND, the source of the NMOS 8 has the different potential from the ground potential GND due to the resistance element 7. Accordingly, when current flows in the NMOS 8, the voltage between the gate and the source fluctuates, which produces a potential difference between the source and the bulk. Therefore, the threshold value voltage fluctuates due to the voltage fluctuation between the gate and the source and the back gate effect. More specifically, the threshold value voltage of the NMOS 8 becomes somewhat higher. Since the resistance element 3 and the resistance element 7 have the same resistance value, the fluctuation of the threshold value of the NMOS 4 and the NMOS 8 is almost equal to each other. Accordingly, the current almost identical to the active current of the NMOS 4 flows in the NMOS 8.

The voltage decreases when the current flows from the NMOS 4 to the resistance element 3. The source voltage increases and the voltage between the gate and the source fluctuates due to this voltage decrease. In other words, the source voltage of the NMOS 4 increases from the ground potential GND by the voltage amount corresponding to the current value flowing from the NMOS 4 to the resistance element 3 and the resistance value of the resistance element 3. As such, the potential of the node 20 increases from the ground potential GND. The resistance element 7 is connected to the NMOS 8 of the second current generating circuit 12 as well. The voltage decreases due to the resistance element 7. The source voltage of the NMOS 8 increases as is the same way as the NMOS 4. The voltage between the gate and the source of the NMOS 8 fluctuates as in the same way as the voltage between the gate and the source of the NMOS 4. The threshold value voltage of the NMOS 8 fluctuates as in the same way as the threshold value voltage of the NMOS 4. It is possible to make the off-leak current of the NMOS 8 equal to the off-leak current of the NMOS 4. The superimposed current also changes in accordance with the off-leak current of the NMOS 4, and the off-leak current of the NMOS 4 and the superimposed current become equal to each other. Accordingly, the off-leak current of the NMOS 4 can be canceled by the superimposed current. It is possible to correct the output current accuracy in the low voltage input, and to realize the voltage-current converter which enables simple current control. For example, the output current can be corrected even when the ambient temperature is changed.

Figure 5:
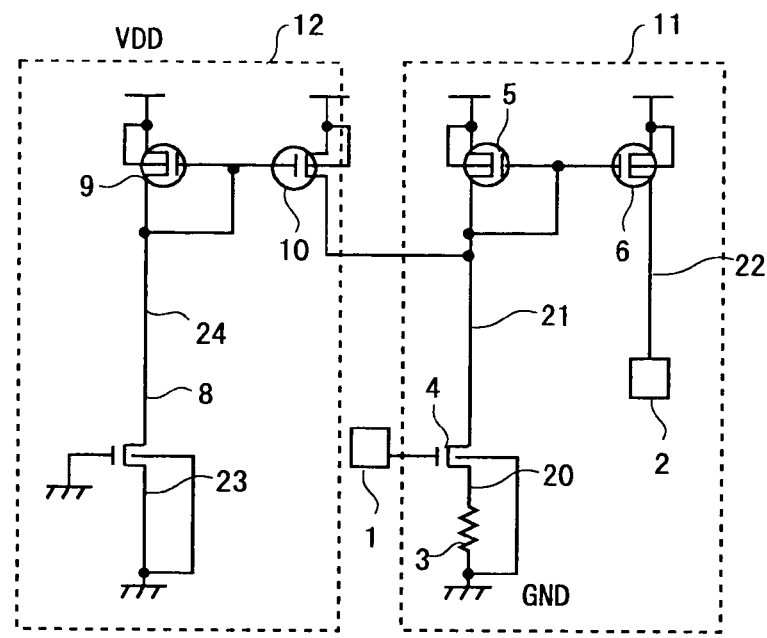
FIG. 5 is a circuit diagram showing a configuration of a voltage-current converter employing the off-leak current cancel circuit of FIG. 4.

As described above, there is provided a resistance element 7 between the NMOS 8 and the ground potential GND in the second current generating circuit 12. The superimposed current for canceling the off-leak current of the NMOS 4 is output from the second current generating circuit 12. Accordingly, the superimposed current has a value according to the off-leak current of the NMOS 8. Furthermore, since the NMOS 4 and the NMOS 8 have the same property, the off-leak current becomes equal to each other. As such, the superimposed current changes according to the off-leak current of the NMOS 4. This superimposed current is superimposed on the active current of the NMOS 4. Accordingly, it is possible to correct the output voltage with higher accuracy than the voltage-current converter as shown in FIG. 5. In summary, the gate and the source of the NMOS 8 are directly connected to the ground potential GND in the voltage-current converter shown in FIG. 5. Accordingly, in the voltage-current converter shown in FIG. 5, the threshold value voltage does not change due to the voltage fluctuation between the gate and the source or the back gate effect. Therefore, it is not possible to cancel the off-leak current without fail in the voltage-current converter shown in FIG. 5, which means that the output current accuracy cannot be improved.

In the voltage-current converter according to the exemplary embodiment, the gate of the NMOS 8 is connected to the ground potential GND; therefore, the superimposed current does not change according to the input voltage. Therefore, the second current generating circuit 12 outputs the superimposed current having the current value which does not relate to the input potential of the input terminal 1. Further, the gate and the source of the NMOS 8 have the different potential with each other. As such, the off-leak current can be canceled without fail even with the voltage-current converter in which the resistance element 3 is connected to the source of the NMOS 4 which is the input transistor. More specifically, the second current generating circuit 12 is the constant current circuit generating the superimposed current having the current value equal to the current value flowing in the NMOS 4 except the superimposed current when the input level of the NMOS 4 is in the ground potential GND. Therefore, the active current of the NMOS 4 becomes equal to the superimposed current when the input level of the NMOS 4 is in the ground potential GND. Accordingly, it is possible to cancel the off-leak current without fail. The off-leak current of the NMOS 4 is correctly reproduced in the second current generating circuit 12 to be output to the NMOS 4 as the superimposed current. Accordingly, the output current accuracy with respect to the input voltage can be improved.

Figure 2:
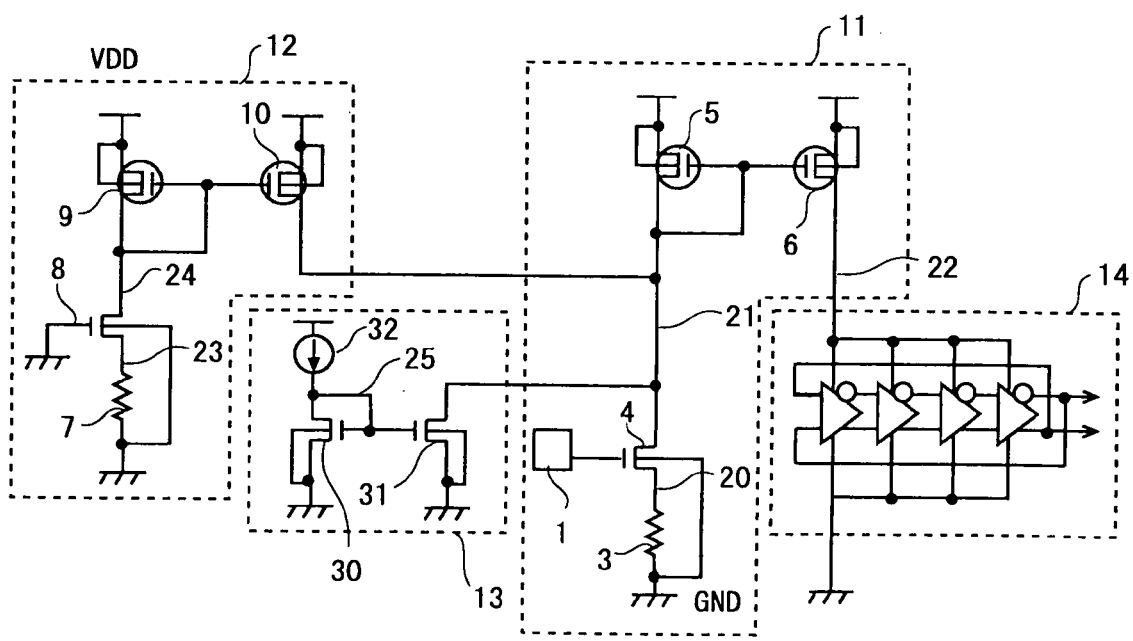
FIG. 2 is a circuit diagram showing a configuration of a voltage controlled oscillator according to the exemplary embodiment of the present invention.

Now, an example of employing the voltage-current converter shown in FIG. 1 will be described with reference to FIG. 2. FIG. 2 is a circuit diagram showing a configuration of a voltage controlled oscillator (VCO) including the voltage-current converter shown in FIG. 1. As shown in FIG. 2, the VCO includes a first current generating circuit 11, a second current generating circuit 12, a third current generating circuit 13, and an oscillator 14. In summary, the VCO has a circuit configuration in which the third current generating circuit 13 and the oscillator 14 are added to the voltage-current converter shown in FIG. 1. Since the first current generating circuit 11 and the second current generating circuit 12 have the similar circuit configuration as the circuit shown in FIG. 1 and perform the same way as in the circuit shown in FIG. 1, the description will be omitted here. The VCO is a circuit used in generating clocks or the like. The first current generating circuit 11, the second current generating circuit 12, the third current generating circuit 13, and the oscillator 14 are formed on the same semiconductor substrate.

The third current generating circuit 13 is the constant current circuit and is connected to the node 21. The third current generating circuit 13 includes an NMOS 30, an NMOS 31, and a current source 32. The NMOS 30 has a gate and a drain connected to the current source 32 through a node 25. A source of the NMOS 30 is connected to the ground potential GND. The NMOS 31 has a gate connected to the current source 32 through the node 25, a drain connected to the node 21, and a source connected to the ground potential GND. The NMOS 31 has a gate length identical to that of the NMOS 30. A gate width of the NMOS 31 is n times (or 1/n times) as large as the gate width of the NMOS 30.

The oscillator 14 oscillates in an oscillation frequency according to the output current from the first current generating circuit 11. Therefore, the oscillator 14 is able to generate the clock signal according to the output current from the first current generating circuit 11. In other words, the oscillator 14 is connected to the output terminal 2 of FIG. 1. Note that the circuit configuration of the oscillator 14 is not specifically limited.

In the first current generating circuit 11, the current flows in the node 21 through the NMOS 4 as the potential of the input terminal 1 increases. The PMOS 5 is connected to the node

21. The PMOS 6 is connected to the PMOS 5 constituting a current mirror circuit of the current ratio of 1/n (or n) multiples. Accordingly, the output current 1/n (or n) times as large as the PMOS 5 flows in the node 22 through the PMOS 6. Then the oscillation frequency of the oscillator 14 can be controlled by the output current.

In the third current generating circuit 13, the current flows in the NMOS 30 from the current source 32 through the node 25. Accordingly, the current 1/n (or n) times as large as the NMOS 30 flows in the node 21 through the NMOS 31. Further, the PMOS 5 is connected to the node 21. The PMOS 6 is connected to the PMOS 5 constituting a current mirror circuit of the current ratio of 1/n (or n) multiples. Accordingly, the current 1/n (or n) times as large as the PMOS 5 flows in the node 22 through the PMOS 6. Accordingly, the oscillation frequency of the oscillator 14 when the input terminal 1 is in the GND level is determined by the third current generating circuit 13. When the input voltage of the input terminal 1 changes, the oscillation frequency changes.

Figure 6:
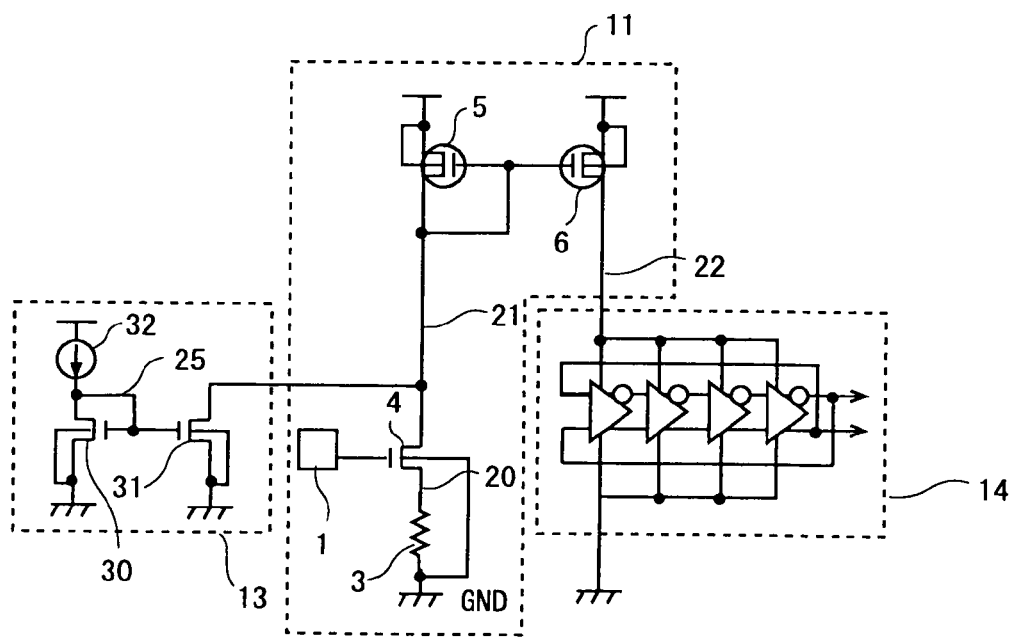
FIG. 6 is a circuit diagram showing a configuration of a voltage controlled oscillator which does not cancel the off-leak current.

FIG. 6 shows a VCO as a comparative example in order to describe the effect of the VCO according to the exemplary embodiment. FIG. 6 shows a circuit configuration of the VCO which does not include a second current generating circuit 12. Therefore, the VCO as the comparative example includes a first current generating circuit 11, a third current generating circuit 13, and an oscillator 14.

When the input terminal 1 is in the ground potential GND level, the oscillation frequency is typically determined only by the current from the third current generating circuit 13. However, when the off-leak current flowing in the NMOS 4 is so large that cannot be ignored, the off-leak current of the NMOS 4 is added to the current from the third current generating circuit 13 in the node 21. The PMOS 5 is connected to the node 21. Further, the PMOS 6 is connected to the PMOS 5. The PMOS 5 and the PMOS 6 constitute a current mirror circuit of the current ratio of 1/n (or n) times.

Accordingly, the current 1/n (or n) times as large as the off-leak current of the NMOS 4 flows in the node 22 in addition to the current amount from the third current generating circuit 13. Therefore, the oscillation frequency increases from what is expected. As a result, according to the circuit configuration in FIG. 6, it becomes difficult to control the frequency. In order to accurately control the frequency, it is needed to correct the output current accuracy of the NMOS 4 in the low voltage input. The VCO shown in FIG. 2 includes a second current generating circuit 12. The second current generating circuit 12 superimposes on the NMOS 4 the superimposed current having the current value identical to the active current flowing when the input potential has a fixed value in the first current generating circuit 11 having the same structure as the related first current generating circuit 11.

The gate of the NMOS 8 of the second current generating circuit 12 is connected to the ground potential GND. Therefore, the superimposed current is supplied from the second current generating circuit 12 to the input transistor NMOS 4 of the first current generating circuit 11. Accordingly, the output current accuracy of the NMOS 4 in the low voltage input can be corrected. As a result, the oscillation frequency depending on the threshold value voltage of the NMOS 4 and the voltage of the input terminal 1 can be obtained.

As such, it is possible to superimpose on the NMOS 4 the superimposed current equal to the active current flowing when the input potential of the input terminal 1 has a fixed value. By adding such a second current generating circuit 12, the output current accuracy in the low voltage input can be corrected. Hence, the oscillation circuit which can easily control the frequency can be realized.

Figure 3:
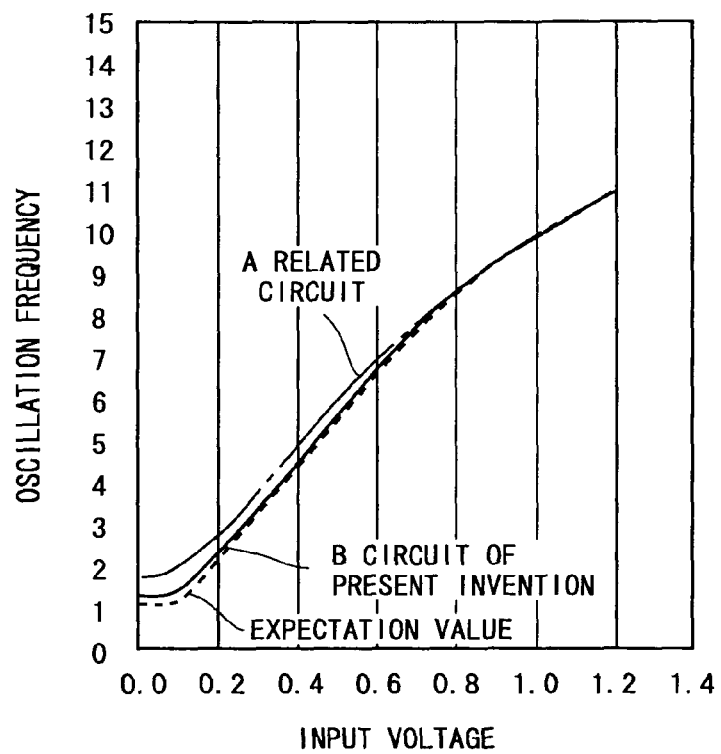
FIG. 3 is a diagram showing an oscillation frequency of the voltage controlled oscillator.
Figure 4:
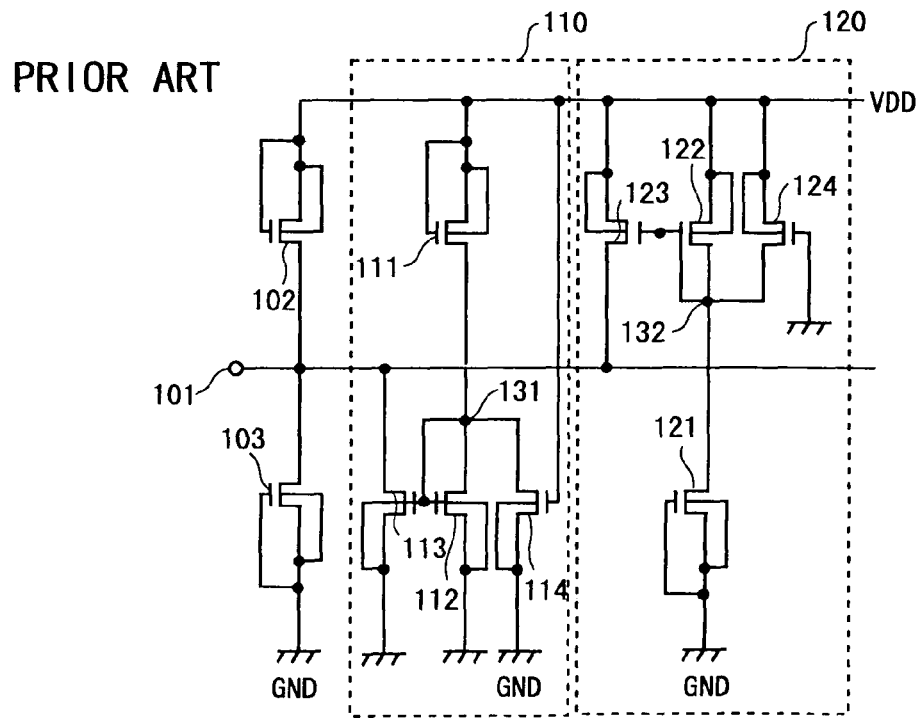
FIG. 4 is a circuit diagram showing a configuration of an off-leak current cancel circuit according to a related art.

Now, the frequency dependency due to the input voltage in the VCO will be described with reference to FIG. 3. The horizontal axis indicates the input voltage of the input terminal 1 of FIGS. 6 and 2, and the vertical axis is what the output frequency of the oscillator 14 is normalized. In FIG. 3, A shown by dashed-dotted line indicates the oscillation frequency in the related circuit, which is the circuit shown in FIG. 6. B shown by solid line indicates the oscillation frequency in the circuit of the present invention, which is the circuit shown in FIG. 2. C shown by dotted line is the expectation value, which is the value when it is assumed that there is no off-leak current flows.

As shown in FIG. 3, in the line A, the frequency is about twice higher than the expectation value due to the off-leak current when the input voltage is 0.1. On the other hand, in the line B, the frequency which is quite close to the expectation value can be obtained even when the input voltage is 0.1. Accordingly, the output current accuracy in the low voltage input can be corrected, which means the voltage-current converter which can easily control the current can be obtained. The circuit of the present invention is effective in realizing the controlling of the oscillation frequency with high accuracy. Hence, the output accuracy with respect to the input voltage can be improved.

Along with the high-speed operation and the low voltage of the LSI, it is needed to reduce the threshold value voltage. In this case, the off-leak current increases; however, the output current can be controlled with high accuracy by the above-described voltage-current converter.

In the present invention, the constant current circuit is added which superimposes on the input transistor the current value equal to the active current flowing when the input potential of the voltage-current converter has a fixed value. According to the present invention, it is possible to realize the analog circuit with high accuracy, and to realize cost reduction by shortening the development period and improving the yield.

Although the input transistor is the NMOS 4 in the above description, the input transistor may be PMOS as well. In this case, the PMOS is used instead of using the NMOS 4 and the NMOS 8. Then each PMOS may be connected to the power supply potential through the resistance element having the same characteristics. In other words, the MOS transistor may be connected to the power supply voltage or the ground potential GND through the resistance element.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A voltage-current converter converting an input voltage input to an input terminal to a current to output the current, the voltage-current converter comprising:

a first current generating circuit including an input transistor comprising a gate connected to the input terminal and generating an output current according to a current flowing in the input transistor; and a second current generating circuit including a transistor comprising a gate having a potential different from a potential of a source and a drain, the second current generating circuit generating a superimposed current according to a current flowing in the transistor to supply the superimposed current to the input transistor, wherein the superimposed current flows between a source and a drain of the input transistor, and wherein the second current generating circuit generates the superimposed current having a current value which does not relate to an input potential of the input terminal.

2. The voltage-current converter according to claim 1, wherein the second current generating circuit comprises a constant current circuit generating the superimposed current having a current value equal to a current value flowing in the input transistor except the superimposed current when an input level of the input transistor is in a ground potential.

3. The voltage-current converter according to claim 1, wherein the transistor in the second current generating circuit is formed on a same substrate as the input transistor and has a size corresponding to a gate length and a gate width of the input transistor.

4. The voltage-current converter according to claim 2, wherein the transistor in the second current generating circuit is formed on a same substrate as the input transistor and has a size corresponding to a gate length and a gate width of the input transistor.

5. The voltage-current converter according to claim 1, wherein:

the input transistor is connected to a ground potential or a power supply potential through a first resistance element, and the transistor is connected to the ground potential or the power supply potential through a second resistance element having same characteristics as the first resistance element.

6. The voltage-current converter according to claim 2, wherein:

the input transistor is connected to a ground potential or a power supply potential through a first resistance element, and the transistor is connected to the ground potential or the power supply potential through a second resistance element having same characteristics as the first resistance element.

7. The voltage-current converter according to claim 3, wherein:

the input transistor is connected to a ground potential or a power supply potential through a first resistance element, and the transistor is connected to the ground potential or the power supply potential through a second resistance element having same characteristics as the first resistance element.

8. The voltage-current converter according to claim 4, wherein:

the input transistor is connected to a ground potential or a power supply potential through a first resistance element, and the transistor is connected to the ground potential or the power supply potential through a second resistance element having same characteristics as the first resistance element.

9. A voltage controlled oscillator, comprising:

a voltage-current converter according to claim 1; and an oscillator oscillating in an oscillation frequency according to an output current from the voltage-current converter.

10. A voltage controlled oscillator, comprising:

a voltage-current converter according to claim 2; and an oscillator oscillating in an oscillation frequency according to an output current from the voltage-current converter.

11. A voltage controlled oscillator, comprising:

a voltage-current converter according to claim 5; and an oscillator oscillating in an oscillation frequency according to an output current from the voltage-current converter.

* * * * *